United States Patent
Zingg et al.

(10) Patent No.: US 8,063,401 B2
(45) Date of Patent: Nov. 22, 2011

(54) TESTING FOR CORRECT UNDERCUTTING OF AN ELECTRODE DURING AN ETCHING STEP

(75) Inventors: Rene P. Zingg, Geroldswil (CH); Sudha Gopalan Zingg, Geroldswil (CH); Herman E. Doornveld, Bellinzona (CH); Theodorus H. G. Martens, Kaohsiung (TW)

(73) Assignee: NXP B.V., Eindhoven (NL)

( * ) Notice: Subject to any disclaimer, the term of this patent is extended or adjusted under 35 U.S.C. 154(b) by 195 days.

(21) Appl. No.: 12/377,735

(22) PCT Filed: Aug. 14, 2007

(86) PCT No.: PCT/IB2007/053227
§ 371 (c)(1),
(2), (4) Date: Feb. 17, 2009

(87) PCT Pub. No.: WO2008/020402
PCT Pub. Date: Feb. 21, 2008

(65) Prior Publication Data
US 2010/0190278 A1      Jul. 29, 2010

(30) Foreign Application Priority Data

Aug. 17, 2006  (EP) .................................... 06119089
Aug. 14, 2007  (WO) .................. PCT/IB2007/053227

(51) Int. Cl.
*H01L 23/58* (2006.01)

(52) U.S. Cl. .................. 257/48; 257/772; 257/E23.023; 257/E21.519; 438/17; 438/612

(58) Field of Classification Search ................... 257/48, 257/772, 773, 775, 776, 779, E23.023–E23.039, 257/E23.015, E23.02, E21.519, E21.508–E21.509; 438/17, 612, 613, 614, 615, 616, 617, FOR. 142
See application file for complete search history.

(56) References Cited

U.S. PATENT DOCUMENTS

| | | | |
|---|---|---|---|
| 4,347,479 A | 8/1982 | Cullet | |
| 4,782,288 A | 11/1988 | Vento | |
| 5,293,006 A | 3/1994 | Yung | |
| 5,293,066 A | 3/1994 | Tsumura | |
| 5,445,589 A | 8/1995 | Shimizu | |
| 6,313,537 B1 * | 11/2001 | Lee et al. | 257/758 |
| 6,417,089 B1 | 7/2002 | Kim et al. | |
| 6,538,335 B2 | 3/2003 | Shimada | |
| 6,633,087 B2 * | 10/2003 | Ker et al. | 257/786 |

(Continued)

FOREIGN PATENT DOCUMENTS
EP     0551382 A1     7/1993

*Primary Examiner* — William D Coleman
*Assistant Examiner* — Su Kim

(57) ABSTRACT

A probe electrode structure on a substrate is described, comprising a first probe electrode and a neighboring second probe electrode on a layer sequence that generally includes, in a direction from the substrate to the probe electrodes, an electrically conductive bottom layer, an electrically insulating center layer and a electrically conductive top layer. The probe-electrode structure of the invention provides a means to detect an undercutting of the first probe electrode in an etching step that aims at removing the top layer from regions outside the first probe electrode. An undercutting that exceeds an admissible distance from the first edge of the first electrode will remove the first top-layer probe section in the first probe opening, which causes a detectable change of the electrical resistance between the first and second probe electrodes.

14 Claims, 4 Drawing Sheets

U.S. PATENT DOCUMENTS

| | | |
|---|---|---|
| 6,828,681 B2 * | 12/2004 | Furuhata .................. 257/758 |
| 6,959,856 B2 | 11/2005 | Oh et al. |
| 6,995,474 B1 | 2/2006 | Ho et al. |
| 2004/0217487 A1 * | 11/2004 | Low et al. .................. 257/780 |
| 2005/0186771 A1 | 8/2005 | Tanida et al. |
| 2006/0131759 A1 * | 6/2006 | Hung et al. ................ 257/786 |

* cited by examiner

US 8,063,401 B2

TESTING FOR CORRECT UNDERCUTTING OF AN ELECTRODE DURING AN ETCHING STEP

FIELD OF THE INVENTION

The present invention relates to a probe-electrode structure on a substrate, comprising a first probe electrode and a neighboring second probe electrode on a layer sequence that generally includes, in a direction from the substrate to the probe electrodes, an electrically conductive bottom layer, an electrically insulating center layer and an electrically conductive top layer. The invention further relates to an integrated-circuit device comprising such a probe-electrode structure, a method for fabricating a probe-electrode structure, a method for fabricating an integrated-circuit device, and a method for testing an integrated circuit-device for over-etching of a top layer arranged underneath an electrode during processing.

BACKGROUND OF THE INVENTION

During fabrication of an integrated-circuit devices, proper etching of the electrically conductive top layer is required outside the electrodes in order to avoid electrical short cuts during operation of the integrated-circuit device. The electrically conductive top layer may for instance form a seed metallization layer, which forms a common electrode during galvanic growth of the electrodes that connect the active areas of an integrated-circuit device to external devices.

A precise control of the etching is required to avoid an over-etching of the top layer, which would form a reliability risk.

U.S. Pat. Nos. 6,417,089 and 5,293,006 describe methods to reduce an undercutting of an under-bump metallurgy (UBM) by liquid or solid inter-diffusion between the bump material and the UBM. However, it remains difficult to detect such phenomena and to assess whether fabricated integrated-circuit devices have a high reliability risk that leads to short circuits and cracks during later operation by the end costumer.

SUMMARY OF THE INVENTION

According to a first aspect of the invention, a probe-electrode structure on a substrate is provided, which comprises a first probe electrode and a neighboring second probe electrode on a layer sequence that generally includes, in a direction from the substrate to the probe electrodes, an electrically conductive bottom layer, an electrically insulating center layer, and an electrically conductive top layer. In the probe-electrode structure of the first aspect of the invention, the center layer has respective first and second contact openings, in which the top layer is arranged between the first or second probe electrode, respectively, on one side and a respective first or second bottom-layer section of the bottom layer on the other side. The center layer further has a first probe opening that is arranged on the second bottom-layer section but underneath the first probe electrode between a first edge of the first probe electrode and a first edge of the first contact opening.

The probe-electrode structure of the first aspect of the invention allows detecting an over-etching underneath the electrode that exceeds an admissible threshold distance. In the probe-electrode structure, the top layer electrically connects the first and second bottom-layer sections, which are otherwise electrically isolated from each other. Furthermore, the top layer has a first top-layer probe section in the first probe opening, the first top-layer probe section being arranged underneath the first probe electrode on the second bottom-layer section.

The probe-electrode structure of the invention provides a means to detect an undercutting of the first probe electrode in an etching step that aims at removing the top layer from regions outside the first probe electrode. An undercutting that exceeds an admissible distance from the first edge of the first electrode will remove the first top-layer probe section in the first probe opening. A removal of the first top-layer probe-section will change the electrical resistance of an electrical connection between the first probe electrode and the neighboring second probe electrode, because it is the top layer, which electrically connects the first and second bottom-layer sections and may, in a preferred embodiment, thus form the only electrical connection between the first and second probe electrodes.

A change of the electrical resistance may be caused by different processes, which may occur as a consequence of an excessive undercutting of the first probe electrode. One effect could be an undesired metallurgy, such as a direct contacting of the material of the first probe electrode with the material of the bottom layer. If both materials are metals, an intermetallic compound might form, which has a different electrical resistance than the original layer structure. Another effect that might occur is that the excessive undercutting of the first probe electrode may interrupt the electrical connection between the first and second probe electrodes.

Typically, if an excessive under-etching is detected at a first probe electrode, a comparably excessive under-etching will also occur at all other electrodes, which are provided on the same substrate in exposed to the same processing. Therefore, the probe electrode structure of the present invention provides a means to detect a reliability risk formed by an undercutting of the electrodes that exceeds a measure provided by the position of the first probe opening in relation to the first edge of the first probe electrode.

The probe electrode may or may not have an additional function beyond the described test function for excessive undercutting. However, since testing for undercutting requires applying a voltage between the first and second probe electrodes, only one of them can be used to carry electrical signals to the outside. The probe electrode could also serve as a stress-relieve bump. It should be noted that the probe-electrode structure of the present invention also serves as a monitor for the correctness of the lateral positioning and the lateral extension of the first probe electrode and, thus, all other electrodes manufactured by the same processing. For an incorrect positioning or a too small lateral extension will also lead to a removal of the first top-layer probe section in the first probe opening during an etching of the top layer. The first or second probe electrode can also have a supportive function.

The probe electrode structure of the present invention can form a stand-alone testing device that can be used when adjusting processing parameters. It can also be used within a process-evaluation module. It has the advantage of providing increased statistical data, particularly when used in the context of a process for products manufactured in high volumes.

In the following, preferred embodiments of the probe electrode structure of the first aspect of the invention will be described. The embodiments can be combined with each other, unless explicitly described as alternative embodiments. In one embodiment, the first probe opening is arranged at a predetermined probe distance from the first edge of the first probe electrode. The predetermined probe distance can be chosen according to the requirements of the particular electrode structure and according to the state of the processing technique. Currently, for example, the art requires an over-etching of a top layer formed by an UBM underneath an electrode by about 1 µm. Therefore, the probe distance should be selected as about 1 µm from the first edge of the first probe electrode.

Preferably, the first probe opening is arranged in a corner position at a predetermined probe distance from the first edge and a further edge of the first probe electrodes. By this arrangement, the probe-electrode structure is sensitive to undercutting from two different directions, which will also lead to the detection of a lateral misalignment.

In another embodiment, the first and second bottom-layer sections are separated by a bottom-layer opening whose sidewalls and bottom face are covered by the center layer underneath the first and second probe electrode, and wherein the deposited center layer in the bottom-layer opening circumscribes a recess of a size that is suitable for transport of a liquid. The recess can be filled with material of the top layer. During processing, this structure provides the advantage of allowing etchant access.

In alternative embodiments the first probe electrode or the bottom layer are each made of one respective material chosen from Gold (Au), Copper (Cu), Aluminum (Al), Lead (Pb), and Tin (Sn), or a respective combination of materials chosen from Au, Cu, Al, Pb, and Sn. The probe-electrode structure has particular advantages where the bottom layer and the top layer contain different materials, which tend to interact and form undesired compounds. For instance, a direct contacting of Gold in the electrode and Aluminum in the bottom layer may lead to the formation of an undesired porous intermetallic compound, which is also known as "purple plague". This undesired effect can be detected by use of the probe electrode structure, and thus processing can be adapted so that the formation of intermetallic compounds is avoided.

Preferably, therefore, the center layer forms a barrier against interpenetration between the material of the first or second probe electrode and the material of the bottom layer. This way, the formation of undesired intermetallic compounds is avoided, where the center layer is present. The center layer assumes the function of a passivation layer in this preferred embodiment.

In a further embodiment the top layer either contains or consists of Titanium (Ti) or a Titanium-Tungsten compound.

In one embodiment, the probe-electrode structure further comprises a third probe electrode. In this embodiment, the center layer has a third contact opening, in which the top layer is arranged between the third probe electrode on one side and a third bottom-layer section of the bottom layer on the other side. Furthermore, the center layer further has a second probe opening that is arranged on the third bottom-layer section but underneath the first probe electrode between a second edge of the first probe electrode and a second edge of the first contact opening. The top layer electrically connects the first and third bottom-layer sections, which are otherwise electrically isolated from each other. Finally, in this embodiment, the top layer has a second top-layer probe section in the second probe opening, the second top-layer probe section being arranged underneath the first probe electrode on the third bottom-layer section.

The present embodiment does comprises three probe electrodes, and testing is performed by applying a voltage between the first and the third probe electrode, which are both connected via the first probe electrode. Using two different probe openings at different edges (sides) of the probe electrode improves the detectability of the effects of a lateral misalignment. Preferably, the probe openings are in a diagonal arrangement at different corner positions of the first probe opening. Alternatively, testing can be performed using two different measurements between the first and the second probe electrode, and between the first and the third probe electrode, to separately test the different top-layer probe sections in the corresponding probe openings.

The concept can be further developed to providing a fourth probe electrode. In this embodiment with a fourth probe electrode the center layer has a fourth contact opening, in which the top layer is arranged between the fourth probe electrode on one side and a fourth bottom-layer section of the bottom layer on the other side. Furthermore, the center layer further has a third probe opening that is arranged on the fourth bottom-layer section but underneath the first probe electrode between a third edge of the first probe electrode and a third edge of the first contact opening. The top layer electrically connects the first and fourth bottom-layer sections, which are otherwise electrically isolated from each other. Finally, in this embodiment, the top layer has a third top-layer probe section in the third probe opening, the third top-layer probe section being arranged underneath the first probe electrode on the fourth bottom-layer section.

In this embodiment, testing can be performed by applying voltage between different pairs of the four probe electrodes. Depending on the arrangement of the respective probe opening, a particular test between two probe electrodes will provide information whether or not the undercutting produced in a step of etching the top layer is within admissible limits.

According to a second aspect of the present invention, an integrated-circuit device is provided, which comprises a probe electrode structure according to the first aspect of the invention. Preferred embodiments of the integrated-circuit device of the second aspect of the invention incorporate the additional features of the embodiments of the probe electrode structure of the first aspect of the invention.

In a further preferred embodiment of the integrated-circuit device of the second aspect of the invention, one of the probe-electrodes is connected to circuitry, which is provided in the integrated-circuit device. In this embodiment, the probe electrode that is connected to circuitry can be use to communicate electric signals to the outside world, beside the testing functionality. The circuitry can for instance be formed by test circuitry, which is operated during electrical testing of the probe electrode structure.

According to a third aspect of the invention, a method is provided for fabricating a probe-electrode structure. The method comprises the steps of
  providing a substrate;
  fabricating an electrically conductive bottom layer on the substrate that has first and second bottom-layer sections, which are electrically isolated from each other;
  fabricating an electrically insulating center layer on top of the bottom layer, and fabricating first and second contact openings in the center layer on the first and second bottom-layer sections, respectively, and at least one first probe opening in the center layer on the second bottom-layer section;
  depositing an electrically conductive top layer on the center layer, in the first and second contact openings, and in the first probe opening, thus electrically connecting the first and second bottom-layer sections with each other;
  fabricating first and second probe electrodes on top of the first and second bottom-layer sections, such that the first probe opening is arranged on the second bottom-layer section but underneath the first probe electrode between a first edge of the first probe electrode and a first edge of the first contact opening.

The method of the invention allows fabricating the probe-electrode structure of the first aspect of the invention and therefore shares the advantages described above.

According to a fourth aspect of the invention a method is provided for fabricating an integrated-circuit device on a substrate. The method comprises the steps:

fabricating at least one electrode on a layer sequence that generally includes, in a direction from the substrate to the electrode, an electrically conductive bottom layer, an electrically insulating center layer and an electrically conductive top layer;

fabricating a probe electrode structure according to the first aspect of the invention or one of its embodiments.

The method further comprises the step of etching the top layer in regions outside the electrode and outside the first and second probe electrodes, accepting a removal of portions of the top layer underlying the electrode and the probe electrodes. The steps of fabricating the at least one electrode and the probe electrode structure are performed in arbitrary order or concurrently.

The method of the fourth aspect of the invention shares the advantages of the method of the first aspect of the invention. Integrating the probe electrode structure on an integrated-circuit device allows testing an actual processed device or wafer for process accuracy. This way, the device production can be monitored.

According to a fifth aspect of the present invention, a method is provided for testing an integrated-circuit device for over-etching of a top layer arranged underneath an electrode during processing. The method comprises the steps:

providing an integrated-circuit device after processing according to the method of the fourth aspect of the invention;

applying a voltage between the first and second probe electrodes; and measuring a quantity that depends on the electrical resistance of an electrical connection between the first and second probe electrodes.

The testing method of the present aspect of the invention allows preventing reliability problems that arise from the previously described undercutting process of electrodes during fabrication of an integrated-circuit device. The testing method allows detecting an over-etching underneath an electrode during processing of the integrated-circuit device This way, an inadmissibly high undercutting can be detected and devices, which do not pass the test can be sorted out. Furthermore, the test method allows electrical testing of a wafer immediately after processing. It can also be used in the process of setting or adjusting fabrication parameters such as etching temperature or duration of exposure to an etchant.

BRIEF DESCRIPTION OF THE DRAWINGS

The invention will now be explained in more detail with reference to the drawings

DETAILED DESCRIPTION OF EMBODIMENTS

Figure 1:
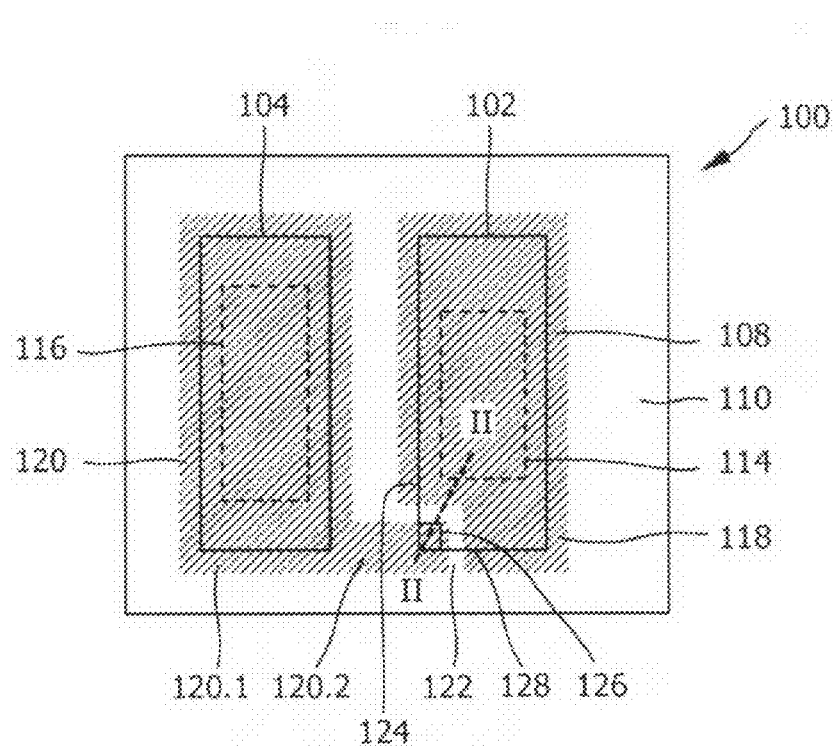
FIG. 1 shows a schematic top view of a first embodiment of a probe-electrode structure.
Figure 2:
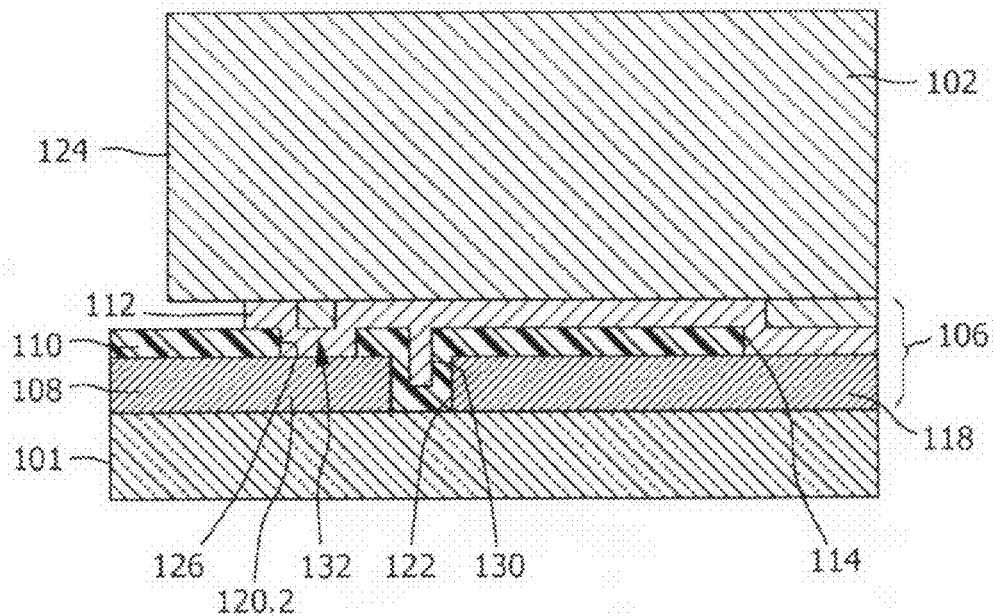
FIG. 2 shows a schematic cross-sectional view of the probe-electrode structure of FIG. 1.

FIG. 1 shows a schematic top view of a first embodiment of a probe-electrode structure 100. FIG. 2, which will be described in parallel with FIG. 1, shows a schematic cross-sectional view of the probe-electrode structure 100 along the dotted line II-II shown in FIG. 1.

The probe-electrode structure 100 is provided on a substrate 101. The substrate 101 is in one embodiment a fully processed wafer or chip with integrated circuitry according to a desired application. Details of the circuitry and further structural elements of the substrate are know to a person of ordinary skilled in the art and therefore not shown in the present figures.

The probe-electrode structure 100 comprises a first probe electrode 102 and a second probe electrode 104. Only the outlines of the first and second probe electrodes are shown in the schematic top view of FIG. 1. The first and second probe electrodes have a rectangular outline in the present embodiment. This specific outline is of exemplary nature. In the art, the term "bump" is also used for referring to an electrode.

The probe electrodes 102 and 104 are made of an electrically conductive material, typically a metal. Suitable metals are for instance Gold (Au), Copper (Cu), or Aluminum (Al).

The first and second probe electrodes are arranged on a layer sequence 106 that generally includes, in a direction from the substrate 101 to the probe-electrodes, an electrically conductive bottom layer 108, an electrically insulating center layer 110 and an electrically conductive top layer 112. When stating that the layer sequence 106 "generally" includes the layers 108 to 112, reference is made to specific modifications of the layer sequence in certain regions, which will be described in the following paragraphs. A first modification provided in the layer sequence 106 is formed by a contact opening 114, the outline of which is shown by a dashed rectangle in FIG. 1. A contact opening of the second probe electrode 104 is shown by reference label 116. The top layer 112 is conformally deposited in the contact opening 114, thus covering the side walls and the bottom face, directly abutting the bottom layer 108. The material of the electrode 102 fills the remaining space that is created by the contact opening 114 on top of the top layer 112.

The bottom layer 108 is divided into separate bottom-layer sections in the region of the first and second probe electrodes 102 and 104. Even though it is arranged underneath the center layer 114, first and second bottom-layer sections 118 and 120, respectively, are shown in the schematic top view of FIG. 1 to make their lateral shape visible. The second bottom-layer section 120 has a lateral shape that resembles the letter L. A subsection 120.1 that corresponds to the vertical bar of the letter L extends underneath the second probe electrode 104. The lateral extension of the subsection 120.1 of the second probe electrode is somewhat larger than that of the electrode. The bottom layer has the function of a top metal layer as known from integrated-circuit device according to the prior art. The lateral extension of the subsection 120.1 of the bottom-layer section 120 typically follows existing design rules.

The bottom-layer section 120 also has a horizontal subsection 120.2, which extends between the first and second probe electrodes 102 and 104, and continues underneath the lower left edge of the first probe electrode 102. The second bottom-layer section 120 is separated from the first bottom-layer section 118 underneath the remaining part of the first probe electrode 102 by a bottom layer opening in the form of a trench 122, which is conformally covered by the center layer 110. Even though the bottom-layer section 118 and 120 are not directly connected with each other, an electrical connection is provided by the top layer 112. The top layer has a top-layer probe section, that extends between a left edge 124 of the first probe electrode and through a probe opening 126 in the center layer 110. The probe opening can is arranged between the left edge 124 of the first probe electrode and the closest edge of the contact opening 114. In the present embodiment, the probe opening 126 is arranged underneath a lower left corner close to the left edge 124 and to a lower edge 128 of the first probe electrode. It should be noted that the probe opening 126 must be arranged on the second bottom-layer section 120, that is, in the present example, left of the trench 122.

The distance of the probe opening 126 from the left edge 124 of the first probe electrode is chosen according to the technology requirements. For example, the current state of the art requires an over-etching of the top layer 112 by about 1 μm. Accordingly, in order to be able to detect an over-etching of the top layer 112 that extends beyond this distance, the probe opening 126 should be arranged approximately 1 μm inside of the left edge 124 of the first probe electrode 102. The probe layer is shown in FIG. 2 in a state, in which an over-etching has been performed that does not exceed the admissible range. Therefore, the probe opening 126 is conformally covered with the top layer 112. The remaining space created by the conformal deposition during fabrication is filled with electrode material.

The conformal deposition of the center layer in the trench 122 leads to the formation of recess 130, which is filled with top-layer material. The recess 130 typically has the form of a drop or keyhole. The actual shape is not accurately represented in FIG. 2 for reasons of simplicity of graphical representation. During fabrication, the recess 130 allows distribution of an etchant, before the deposition of the top layer 112. The recess 130 forms a narrow capillary which is conductive to initial wetting by, e.g., processing acids. However, due to its length/cross-section ratio this "keyhole" does not lend itself to stopping the etching by rinsing with e.g.

deionized water. This keyhole is fabricated using a suitable distance of the two metal connections formed by the bottom-layer subsection 120.2 and the first bottom-layer section 118. A cross-sectional profile of these layer sections is overhanging in one embodiment (not shown), depending on the manufacturing parameters. Furthermore, a suitable thickness of the dielectric center layer 110 is needed. The center layer 110 often has higher deposition rates at convex points and reduced deposition in concave corners and recesses due to depletion of reactants. Together, this results in a drop shaped cross-section. Such a keyhole can result in a large reservoir for continued etching of the critical top layer 112.

In a typical device structure, the layer sequence 106 has a bottom layer, which is made of Aluminum (Al). The center-layer material can be an oxide or nitride or an oxinitride of Silicon (Si). The top layer may be made of Titanium (Ti) or a Ti-W compound. In this configuration, the top layer is also referred to as under bump metallurgy layer 112, whereas, as mentioned before, the center layer is referred to as a passivation layer 110, and the bottom layer is referred to as a top metal layer of the underlying integrated circuit device.

During operation of the probe-electrode structure 100, a voltage is applied between the first and second probe electrodes 102 and 104. The voltage can be applied before and after an etching step that removes the top layer material. The resistance of the electrical connection between the first and second probe electrodes is strongly influenced by changes in the top-layer probe section 132 of the top layer 112. For instance, if the top layer 112 is completely removed between the left edge 124 of the electrode and the trench 122, the electrical connection between the first and second bottom-layer sections 118 and 120 will be interrupted. As a consequence, no current will be detected in a current measurement between the first and second probe electrodes. Other material changes are possible as a consequence of an excessive over-etching that extends into or beyond the probe opening 126. For instance, if the material of the probe electrode 102 and of the bottom layer 108 interact, a porous and unfavorable intermetallic compound can be formed. This compound has a different resistance than the original top metal layer, which will lead to a detectable signal contrast, for instance in a current measurement. Therefore, a signal indicative of an increased resistance between the first and second probe electrodes 102 and 104 is a clear sign of an excessive over-etch that has affected the top-layer probe section 132 in the probe opening 126.

The detection of such excessive under-etching allows a detection and removal of devices affected, which has not been possible in the prior art. This reduces the risk of delivering devices with pour quality or pour reliability during later operation.

It is noted that the lateral extension of the first probe opening should be selected so as to provide a sufficient signal contrast between a well-processed device and a device that has been exposed to excessive over-etching. In one embodiment, the lateral extension of the probe opening is about 2 micrometer. A smaller size increases the sensitivity, but will on the other hand be more susceptible to lithography and etching effects of this opening, which could falsify the data. As lithography and etching process of the passivation layer 110 progresses a general evolution to smaller lateral dimensions of the probe opening can be expected over time.

The shape of the probe opening need not necessarily be symmetrical. In the example of FIG. 1, the probe opening has the shape of a square. However, a shape of a rectangle with different side lengths can also be used. The lateral shape of the probe opening can also be that of an oval, an ellipse, or a circle.

Note that other features in the passivation layer 110 are much bigger; the standard openings to contact bump with the top metal are typically larger than 6*6 micrometer (design rule), and in some embodiments in the range of 15*50 μm, almost as large as the bump.

Figure 3:
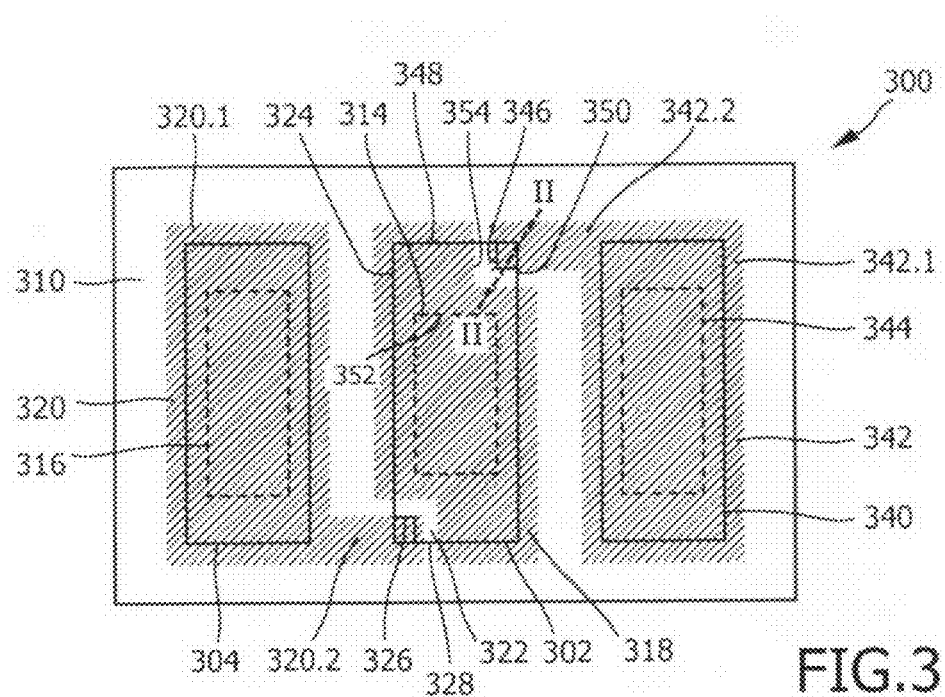
FIG. 3 shows a schematic top view of a second embodiment of a probe-electrode structure.
Figure 4:
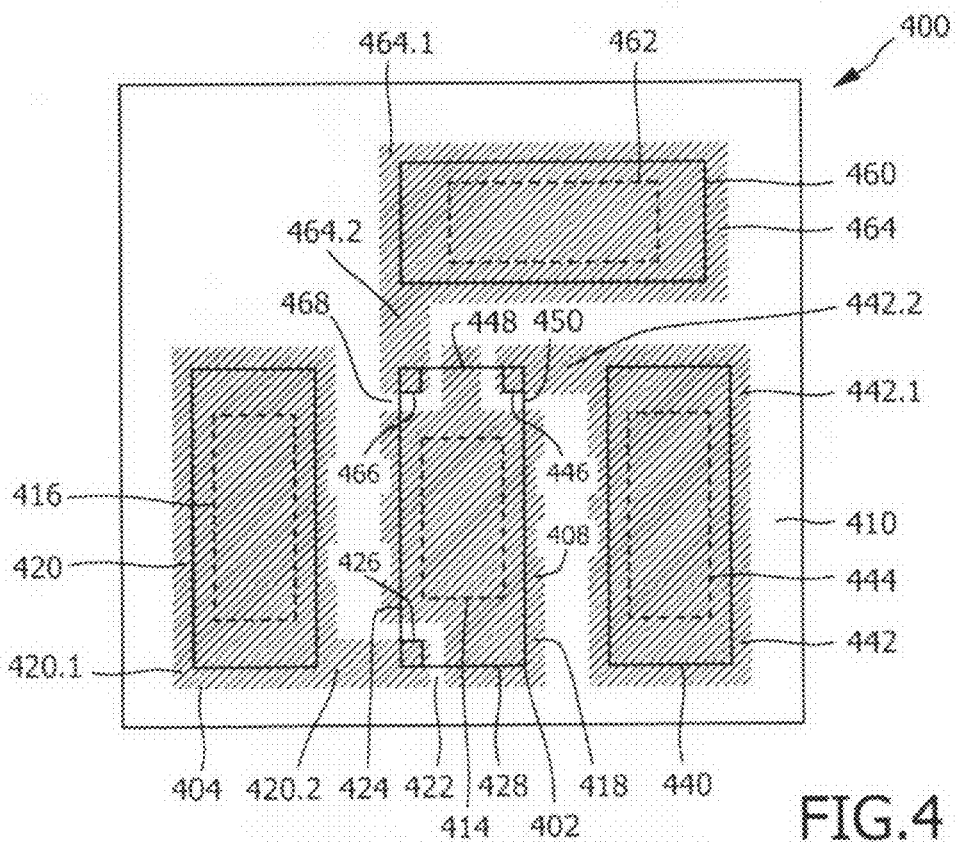
FIG. 4 shows a schematic top view of a third embodiment of a probe-electrode structure.

FIGS. 3 and 4 show schematic top views of two further embodiments of a probe-electrode structure.

A probe electrode structure 300 shown in FIG. 3 has a first probe electrode 302, a second probe electrode 304 and a third probe electrode 340. The first and second electrodes 302 and 304 generally resemble the first and second electrodes 102 and 104 of the previous embodiment shown in FIGS. 1 and 2. Therefore, reference labels 302 to 332 corresponding to reference labels 102 to 132 of the previous embodiment in the last two digits are used for corresponding structural elements of the probe electrode structure 300, and these structural elements will not be described in detail here. The structure is also based on a substrate with a corresponding layer sequence. Therefore, no additional information beyond that described in the context of FIGS. 1 and 2 needs to be given on the cross sectional profile of the third probe electrode structure.

Structural differences in comparison with the preceding embodiment are present in the first probe electrode 402, and in the provision of the third probe electrode. They will be described next below.

With three probe electrodes, the probe electrode structure 300 serves to detect over-etching problems at different edges of the first probe electrode. In the top view of FIG. 3, the second probe electrode 304 is arranged to the left of the first electrode, like in the embodiment of FIGS. 1 and 2, while the third probe electrode 340 is arranged to the right of the first probe electrode. The center layer (not shown here) has a third contact opening 344, in which the top layer is arranged between the third probe electrode 340 on one side and a third bottom-layer section 342 of the bottom layer on the other side. The center layer further has a second probe opening 346 that is arranged on a subsection 342.2 of the third bottom-layer section underneath the first probe electrode 302 between an upper edge 348 of the first probe electrode and an upper edge 352 of the first contact opening 314. The second probe opening 346 is arranged underneath an upper right corner of the first probe electrode 302, close also to its right edge 350.

Since the cross-sectional structure in the range of the second probe opening exactly corresponds to that of the previous embodiment, a dotted line II-II referring to FIG. 2 is indicated in a manner corresponding to FIG. 1. Thus, the top layer (not visible in the top view of FIG. 3) electrically connects the first and third bottom-layer sections, which are otherwise electrically isolated from each other by a trench 354 resembling the trench 322. The top layer further has a second top-layer probe section (not shown) in the second probe opening 346 corresponding to the first top-layer probe section 132. The second top-layer probe section is arranged underneath the first probe electrode 302 on the third bottom-layer section, which is the shape of an inverted "L" in the top view of FIG. 3.

The diagonal arrangement of top-layer probe sections in the present embodiment improves the detectability of under-etching problems which are caused by a lateral misalignment of an electrode with respect to the underlying layer structure.

Testing can be performed by applying a voltage between the first and third probe electrodes. In this case the first and second top-layer probe sections will contribute to the signal, which is sufficient for sorting out devices that have not the correct test performance after the etching step. It is also possible to perform testing between the first and the second or between the first and the third probe electrodes or to test all possible pairs of probe electrodes for complete information.

Yet a further increase of information on etching performance is achieved with the embodiment of FIG. 4, which comprises four probe electrodes 402, 404, 440, and 460. The first, second and third electrodes 402, 404 and 440 generally resemble the first, second and third probe electrodes 302, 304 and 340 of the previous embodiment shown in FIG. 3. Therefore, reference labels 402 to 454 corresponding to reference labels 302 to 354 of the previous embodiment in the last two digits are used for corresponding structural elements of the probe electrode structure 400, and these structural elements will not be described in detail here. The structure is also based on a substrate with a corresponding layer sequence. Therefore, no additional information beyond that described in the context of FIGS. 1 and 2 needs to be given on the cross sectional profile of the third probe electrode structure.

Structural differences in comparison with the preceding embodiment are present in the first probe electrode 402, and in the provision of the fourth probe electrode. They will be described next below.

With four probe electrodes, the probe electrode structure 400 serves to detect over-etching problems at three different edges of the first probe electrode. In the top view of FIG. 4, the second probe electrode 404 is arranged to the left of the first electrode, like in the embodiment of FIGS. 1 and 2, the third probe electrode 440 is arranged to the right of the first probe electrode, like in the embodiment of FIG. 3, and the fourth probe electrode is arranged on the upper side of the first probe electrode, as seen in the top view of FIG. 4. The center layer (not shown here) has a fourth contact opening 462, in which the top layer is arranged between the fourth probe electrode 460 on one side and a fourth bottom-layer section 464 of the bottom layer on the other side. The center layer further has a third probe opening 466 that is arranged on a subsection 464.2 of the fourth bottom-layer section underneath the first probe electrode 402 between an upper edge 448 of the first probe electrode 402 and the left edge 424 of the first contact opening 414. The third probe opening 466 is arranged underneath an upper left corner of the first probe electrode 402.

Since the cross-sectional structure in the range of the third probe opening exactly corresponds to that of the previous embodiment, reference can again be made to FIG. 2. Thus, the top layer (not shown) electrically connects the first and third bottom-layer sections, which are otherwise electrically isolated from each other by a trench 468 resembling the trench 422. The top layer further has a third top-layer probe section (not shown) in the third probe opening 466 corresponding to the first top-layer probe section 132 of FIG. 2. The third top-layer probe section is arranged underneath the first probe electrode 402 on the fourth bottom-layer section, which is the shape of an rotated letter "L" in the top view of FIG. 4.

The arrangement of three top-layer probe sections in the present embodiment further improves the detectability of under-etching problems which are caused by a lateral misalignment of the electrodes with respect to the underlying layer structure.

Testing can be performed by applying a voltage between the first and third probe or first and fourth electrodes. In this case the first and second or first and third top-layer probe sections, respectively, will contribute to the signal, which is sufficient for sorting out devices that have not the correct test performance after the etching step. It is also possible to perform testing between any other pair of probe electrodes for obtaining more information.

Figure 5:
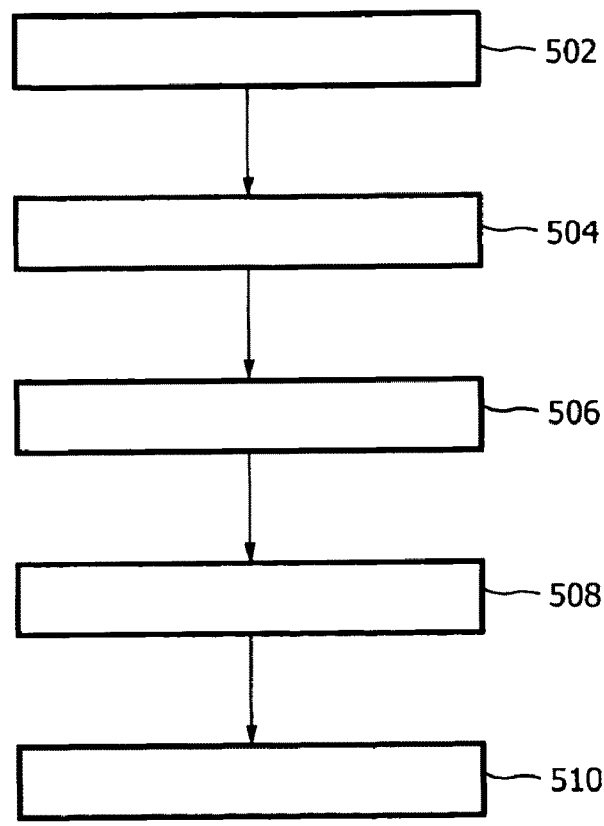
FIG. 5 shows a flow diagram of a method for fabricating a probe-electrode structure.

FIG. 5 shows a flow diagram of a method for fabricating a probe-electrode structure that resembles the probe electrode structure 100 of FIGS. 1 and 2.

The Method Comprises the Steps

502: providing a substrate

504: fabricating a bottom layer. In this step, an electrically conductive bottom layer, which is also referred to as top metal layer in the context of integrated-circuit devices, is fabricated on the substrate. The bottom layer has first and second bottom-layer sections, which are electrically isolated from each other;

506: fabricating and structuring a center layer. In this step, an electrically insulating center layer, which is also referred to as a passivation layer, is fabricated on top of the bottom layer. Furthermore, first and second contact openings are made in the center layer on the first and second bottom-layer sections, respectively, and at least one first probe opening is fabricated in the center layer on the second bottom-layer section;

508: fabricating a top layer. In this step, an electrically conductive top layer, which is also referred to as a seed layer or as an UBM layer is fabricated on the center layer, in the first and second contact openings, and in the first probe opening, thus electrically connecting the first and second bottom-layer sections with each other; and 510: fabricating first and second probe electrodes. In this step, first and second probe electrodes are fabricated on top of the first and second bottom-layer sections, such that the first probe opening is arranged on the second bottom-layer section but underneath the first probe electrode between a first edge of the first probe electrode and a first edge of the first contact opening.

The probe electrode structure fabricated this way can then be exposed to an etching step that removes the top layer and to subsequent testing.

Figure 6:
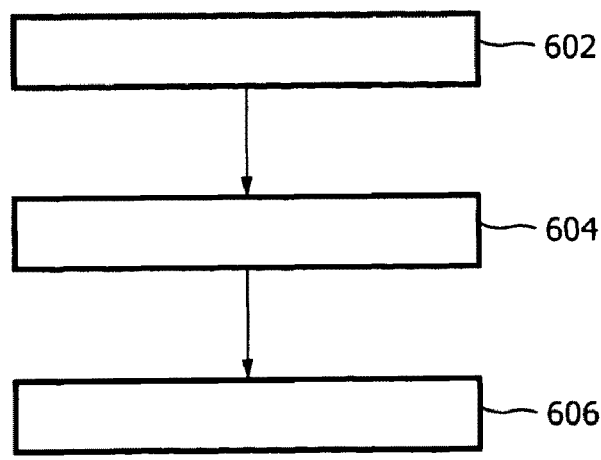
FIG. 6 shows a flow diagram of a method for fabricating an integrated-circuit device.

FIG. 6 shows a flow diagram of a method for fabricating an integrated-circuit device on a substrate.

The method comprises comprising the following steps:
602: fabricating electrodes. In this step, at least one electrode is fabricated on a layer sequence that generally includes, in a direction from the substrate to the electrodes, an electrically conductive bottom layer, an electrically insulating center layer and an electrically conductive top layer;
604: fabricating a probe electrode structure. In this step, the method of the embodiment of FIG. 5 is performed.
606: etching the top layer. In this step, the top layer is etched in regions outside the electrode and outside the first and second probe electrodes, accepting a removal of portions of the top layer underlying the electrode and the probe electrodes;

It should be noted that the steps 602 of fabricating the at least one electrode and 604 of fabricating the probe electrode structure can be performed in arbitrary order. Preferably, they are preformed concurrently.

Figure 7:
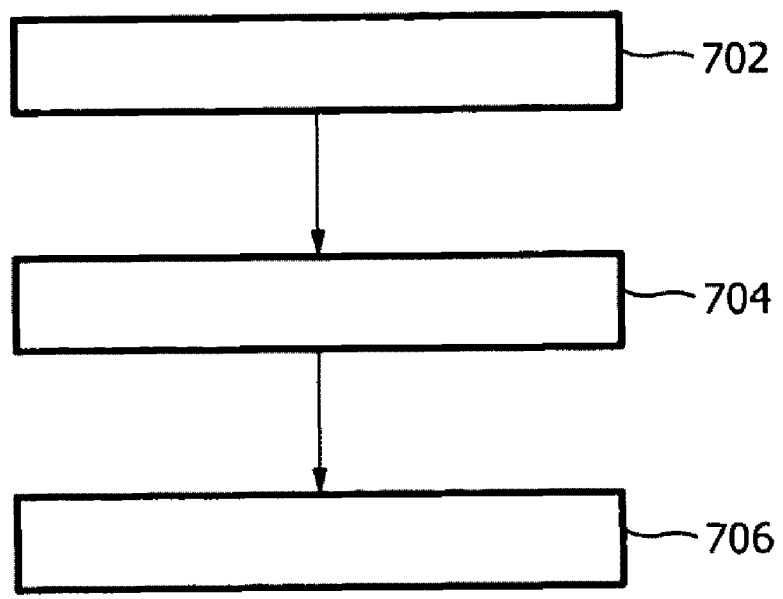
FIG. 7 shows a flow diagram of a method for testing an integrated-circuit device for over-etching.

FIG. 7 shows a flow diagram of a method for testing an integrated-circuit device for over-etching of a top layer arranged underneath an electrode during processing.

The Method Comprises the Following Steps:
702: providing an integrated-circuit device. In this step, an integrated circuit device is provided after processing according to the method of FIG. 6;
704: applying a voltage between the first and second probe electrodes; and
706: measuring resistance; in this step, a quantity that depends on the electrical resistance of an electrical connection between the first and second probe electrodes is measured.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practice the claimed invention, from a study of the drawings, the disclosure, and the appended claims.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination. The mere fact that certain measures are recited in mutually different dependent claims does not indicate that a combination of these measured cannot be used to advantage.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A probe electrode structure comprising:
   a substrate;
   a first probe electrode;
   a second probe electrode; and
   a layer sequence disposed below the first and second probe electrodes and above the substrate, wherein the layer sequence comprises:
      an electrically conductive bottom layer, wherein the bottom layer comprises first and second bottom-layer sections separated by a trench, wherein the first bottom-layer section is disposed below the first probe electrode except for a portion of the first probe electrode, and the second bottom-layer section is disposed below the second probe electrode and extends below the portion of the first probe electrode;
      an electrically insulating center layer, wherein the center layer defines:
         a first contact opening below the first probe electrode;
         a second contact opening below the second probe electrode; and
         a first probe opening below the portion of the first probe electrode,
      wherein the first probe opening is located between a first edge of the first probe electrode and a first edge of the first contact opening;
   and the center layer is further disposed in the trench which separates the first and second bottom-layer sections; and
      an electrically conductive top layer, wherein the top layer is in contact with both the first probe electrode and the first bottom-layer section at the first contact opening, and the top layer is in contact with both the second probe electrode and the second bottom-layer section at the second contact opening, and a top-layer probe section of the top layer is in contact with both the portion of the first probe electrode and the second bottom-layer section at the first probe opening.

2. The probe electrode structure of claim 1, in which the first probe opening is arranged at a predetermined probe distance from the first edge of the first probe electrode.

3. The probe electrode structure of claim 1, in which the first probe opening is arranged in a corner position at a predetermined probe distance from the first edge and a further edge of the first probe electrode.

4. The probe electrode structure of claim 1, wherein the first and second bottom-layer sections are separated by a bottom-layer opening whose sidewalls and bottom face are covered by the center layer underneath the first and second probe electrode, and wherein the center layer in the bottom-layer opening circumscribes a recess of a size that is suitable for transport of a liquid.

5. The probe electrode structure of claim 1, wherein the first probe electrode and the bottom layer are each made of one respective material or a respective combination of materials chosen from Gold, Copper, Aluminum, Lead, and Tin.

6. The probe electrode structure of claim 1, wherein the top layer contains Titanium or a Titanium-Tungsten compound.

7. The probe electrode structure of claims 1, wherein the center layer forms a barrier against interpenetration between the material of the first probe electrode and the material of the bottom layer.

8. The probe electrode structure of claim 1, further comprising a third probe electrode, wherein:
the center layer has a third contact opening, in which the top layer is arranged between the third probe electrode on one side and a third bottom-layer section of the bottom layer on the other side;
the center layer further has a second probe opening that is arranged on the third bottom-layer section but underneath the first probe electrode between a second edge the first probe electrode and a second edge of the first contact opening;
the top layer electrically connects the first and third bottom-layer sections, which are otherwise electrically isolated from each other; and
the top layer has a second top-layer probe section in the second probe opening, the second top-layer probe section being arranged underneath the first probe electrode on the third bottom-layer section.

9. The probe electrode structure of claim 8, further comprising a fourth probe electrode, wherein:
the center layer has a fourth contact opening, in which the top layer is arranged between the fourth probe electrode on one side and a fourth bottom-layer section of the bottom layer on the other side;
the center layer further has a third probe opening that is arranged on the fourth bottom-layer section but underneath the first probe electrode between a third edge of the first probe electrode and a third edge of the first contact opening;
the top layer electrically connects the first and fourth bottom-layer sections, which are otherwise electrically isolated from each other; and
the top layer has a third top-layer probe section in the third probe opening, the third top-layer probe section being arranged underneath the first probe electrode on the fourth bottom-layer section.

10. An integrated-circuit device comprising a probe-electrode structure according to claim 1.

11. The integrated-circuit device of claim 10, wherein one of the probe-electrodes is connected to circuitry.

12. A method for fabricating a probe-electrode structure, the method comprising:
providing a substrate;
fabricating an electrically conductive bottom layer on the substrate, wherein the bottom layer has first and second bottom-layer sections, which are electrically isolated from each other;
fabricating an electrically insulating center layer on top of the bottom layer, and fabricating first and second contact openings in the center layer on the first and second bottom-layer sections, respectively, and at least one first probe opening in the center layer on the second bottom-layer section;
depositing an electrically conductive top layer on the center layer, in the first and second contact openings, and in the first probe opening, thus electrically connecting the first and second bottom-layer sections with each other; and
fabricating first and second probe electrodes on top of the first and second bottom-layer sections, such that the first probe opening is arranged on the second bottom-layer section but underneath the first probe electrode between a first edge of the first probe electrode and a first edge of the first contact opening.

13. The method of claim 12, further comprising:
fabricating an integrated-circuit device on the substrate; and
etching the top layer in regions outside first and second probe electrodes to remove portions of the top layer underlying the probe electrodes.

14. A method for testing an integrated-circuit device for over-etching of a top layer arranged underneath an electrode during processing, the method comprising:
providing an integrated-circuit device comprising:
a first probe electrode;
a second probe electrode;
a layer sequence on which the first and second probe electrodes are disposed, wherein the layer sequence comprises:
a bottom layer that is electrically conductive;
a center layer that is electrically insulating; and
a top layer that is electrically conductive;
wherein the center layer has respective first and second contact openings, in each of which the top layer is arranged in contact with the corresponding first or second probe electrodes and a corresponding first or second bottom-layer section of the bottom layer;
wherein the center layer further defines a first probe opening in the second bottom-layer section but underneath the first probe electrode between a first edge of the first probe electrode and a first edge of the first contact opening;
wherein the top layer electrically connects the first and second bottom-layer sections, which are otherwise electrically isolated from each other; and
wherein the top layer has a first top-layer probe section in the first probe opening, the first top-layer probe section being arranged underneath the first probe electrode on the second bottom-layer section,
applying a voltage between the first and second probe electrodes; and
measuring a quantity that depends on an electrical resistance of an electrical connection between the first and second probe electrodes.

* * * * *